United States Patent
Inenaga

(10) Patent No.: US 7,664,153 B2
(45) Date of Patent: Feb. 16, 2010

(54) LASER DIODE ARRAY, OPTICAL SCANNING DEVICE AND PRINTING APPARATUS

(75) Inventor: Hiroshi Inenaga, Ibaraki (JP)

(73) Assignee: Ricoh Company, Ltd., Tokyo (JP)

( * ) Notice: Subject to any disclaimer, the term of this patent is extended or adjusted under 35 U.S.C. 154(b) by 22 days.

(21) Appl. No.: 12/213,436

(22) Filed: Jun. 19, 2008

(65) Prior Publication Data
US 2008/0317082 A1    Dec. 25, 2008

(30) Foreign Application Priority Data
Jun. 20, 2007    (JP) ................ P2007-162364

(51) Int. Cl.
*H01S 5/00*    (2006.01)
*H01S 3/13*    (2006.01)
*H01S 3/04*    (2006.01)

(52) U.S. Cl. ............. 372/50.12; 372/29.013; 372/34; 372/36

(58) Field of Classification Search ........... 372/29.013, 372/34, 36, 38.05, 50.12
See application file for complete search history.

(56) References Cited

U.S. PATENT DOCUMENTS

| | | | |
|---|---|---|---|
| 4,161,701 A * | 7/1979 | Takeda et al. ................ | 372/36 |
| 6,757,311 B2 * | 6/2004 | Abe ........................ | 372/43.01 |
| 6,844,571 B2 * | 1/2005 | Krames et al. ................ | 257/81 |
| 7,528,540 B2 * | 5/2009 | Ikeda ......................... | 313/498 |
| 7,579,204 B2 * | 8/2009 | Nemoto ...................... | 438/35 |
| 2004/0105471 A1 * | 6/2004 | Kneissl et al. ............... | 372/36 |
| 2006/0007977 A1 * | 1/2006 | Nakatsuka ............... | 372/50.12 |
| 2006/0109883 A1 * | 5/2006 | Lewis et al. ............ | 372/50.12 |
| 2009/0147816 A1 * | 6/2009 | Iga et al. .................. | 372/50.12 |

FOREIGN PATENT DOCUMENTS

| | | |
|---|---|---|
| JP | 6-38542 | 5/1994 |
| JP | 2003-347657 | 12/2003 |

* cited by examiner

*Primary Examiner*—Minsun Harvey
*Assistant Examiner*—Phillip Nguyen
(74) *Attorney, Agent, or Firm*—McGinn IP Law Group, PLLC

(57) ABSTRACT

According to an aspect of the present invention, there is provided a laser diode array including: a laser array chip including: a substrate; and at least three of laser diodes that are formed on the substrate; first electrodes that are formed on each of the laser diodes so as to be isolated from one another; a sub-mount; and second electrodes that are formed on the sub-mount so as to correspond to the first electrodes and so as to be isolated from one another, wherein the laser array chip is mounted on the sub-mount through the first electrodes and the second electrodes, and wherein, among contacting surfaces between each of the first electrodes and a corresponding one of the second electrodes, a contacting area of a central one of the contacting surfaces is larger than that of an end one of the contacting surfaces.

8 Claims, 5 Drawing Sheets

ID ARRAY, OPTICAL SCANNING
LASER DIODE ARRAY, OPTICAL SCANNING DEVICE AND PRINTING APPARATUS

CROSS-REFERENCE TO RELATED APPLICATIONS

The entire disclosure of Japanese Patent Application No. 2007-162364 filed on Jun. 20, 2007 including specification, claims, drawings and abstract is incorporated herein by reference in its entirety.

BACKGROUND OF THE INVENTION

1. Field of the Invention

An aspect of the present invention relates to a laser diode array, an optical scanning device, and a printing apparatus, and particularly relates to the laser diode array including an edge emitting type laser array chip which includes three or more laser diodes and emits plural laser beams, and the optical scanning device and the printing apparatus mounted with the laser diode array.

2. Description of the Related Art

An exemplary configuration of an edge emitting type laser diode array is shown in FIGS. 1 to 3 (see also JP-H06-038542-B).

In FIG. 3, a laser diode array including an edge emitting type laser array chip 1 in which plural laser diodes electrically separated each other by separation grooves 7 are formed in an array shape on a main surface 6a of a semiconductor substrate 6 made of, for example, gallium and arsenic. As shown in FIG. 2, the laser array chip 1 are downwardly faced so that electrodes 8 thereof faces to a mounting area of the sub-mount 2 for mounting the laser array chip 1, and the laser diodes are mounted on the mounting area through the electrodes 8. The sub-mount 2 is made of, for example, silicon carbide. In this case, a common electrode 9 is provided on the bottom surface of the semiconductor substrate 6. In the mounting area of sub-mount 2 for the laser array chip 1, plural electrodes (not shown) in which solder layers are formed on surfaces thereof and arranged at a position opposed to the electrodes 8 of the laser array chip 1. Accordingly, the plural electrodes (not shown) of the sub-mount 2 are electrically and mechanically connected to the electrodes 8 of the plural laser diodes through the solder layers.

As shown in FIG. 1, in an area different from the mounting area of the sub-mount 2, bonding pads for connecting plural bonding wires are formed at positions at which a laser beam is not blocked at the time of connecting wires. The bonding pads connect the other ends of the bonding wires to one ends of plural leads 4 which are formed through a flange 5 of a package and are electrically isolated from the flange 5, thereby forming conductive connection from the outside of the package to the semiconductor laser diodes.

The sub-mount 2 is connected to a heat sink 3 made of a material such as copper having high thermal conductivity in order to suppress heat generation of the laser diodes. In addition, the heat sink 3 is mechanically connected to the flange 5 through solder.

A laser beam is emitted upward from the end surface of the laser array chip 1 in FIGS. 1 and 2.

JP-2003-347657-A discloses a laser diode array in which semiconductor laser diodes are fixed to a heat sink, and in which one of a first pair of electrodes is formed on a contact layer, the other of the first pair of electrodes is formed on the same side as the one electrode on a substrate, the heat sink including a second pair of electrodes is provided on a heat sink substrate, the semiconductor laser diodes are fixed to the heat sink, and the first pair of electrodes are attached to the second pair of electrodes. The laser diode array is capable of reducing the resistance of a wiring and improving electric properties such as threshold current and luminescent efficiency since the first pair of electrodes and the second pair of electrodes can be connected to each other without use of the wire. In particular, it is disclosed that in the laser diode array which has an array shape and includes semiconductor laser diodes arranged in parallel on the heat sink, it is possible to improve a frequency characteristic since non-uniformity of wire resistance between the laser diodes can be reduced.

FIG. 4 is a graph showing a relationship between each electrode of the exemplary laser array chip 1 shown in FIG. 3 and temperature increasing amount in operation. A fourth laser diode and a fifth laser diode are not shown since the fourth and fifth laser diodes are substantially same as a second laser diode and a first laser diode, respectively. In a case in which plural laser diodes are present within the laser array chip 1, as shown in FIG. 4, there occurs a phenomenon that operation temperatures are different between the laser diodes of the laser array chip 1. In particular, the operation temperature of a third laser diode located at the center of the laser array chip 1 is higher than that of the first laser diode and the second laser diode located in the ends thereof. A difference in the operation temperatures of the laser diodes causes an error of laser beam emitting wavelengths among the laser diodes.

With application to a laser beam printing apparatus or the like, a difference in focal distances between scanning beams occurs and a difference in locations or spot diameters of the scanning beams occurs. Therefore, printing quality of the laser beam printing apparatus may be deteriorated.

SUMMARY OF THE INVENTION

An object of the present invention is to provide a configuration for reducing the difference in the operation temperatures of the laser diodes of the laser array chip to reduce the difference in the emitting wavelengths of the laser diodes of the laser array chip.

According to an aspect of the present invention, there is provided a laser diode array including: a laser array chip including: a substrate; and at least three of laser diodes that are formed on the substrate; first electrodes that are formed on each of the laser diodes so as to be isolated from one another; a sub-mount; and second electrodes that are formed on the sub-mount so as to correspond to the first electrodes and so as to be isolated from one another, wherein the laser array chip is mounted on the sub-mount through the first electrodes and the second electrodes, and wherein, among contacting surfaces between each of the first electrodes and a corresponding one of the second electrodes, a contacting area of a central one of the contacting surfaces is larger than that of an end one of the contacting surfaces.

According to another aspect of the present invention, there is provided an optical scanning device including such a laser diode array.

According to still another aspect of the present invention, there is provided a printing apparatus including such a laser diode array.

According to an aspect of the present invention, it is possible to provide a configuration in which a difference of emitting wavelengths between laser diodes can be reduced by decreasing a difference in operation temperatures of the laser diodes in the laser array chip. Moreover, with application to a laser beam printing apparatus, it is possible to provide an optical scanning device in which a difference in locations or spot diameters of scanning beams is small since a difference in the focal distances between the scanning beams can be reduced by reducing the emitting wavelengths of the laser diode and a laser beam printing apparatus capable of performing a high quality printing process.

BRIEF DESCRIPTION OF THE DRAWINGS

Embodiments of the present invention will be described in detail based on the following figures, wherein.

DETAILED DESCRIPTION OF THE INVENTION

The embodiments of the present invention will be described with reference to the following embodiments.

First Embodiment

Figure 1:
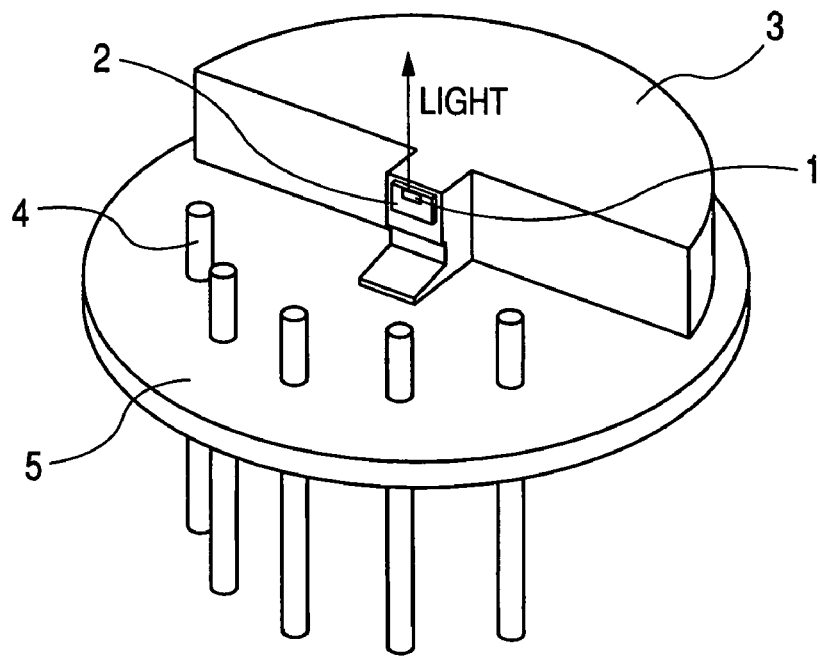
FIG. 1 is a diagram illustrating a laser diode array including an edge emitting type laser array chip with three or more laser diodes.
Figure 2:
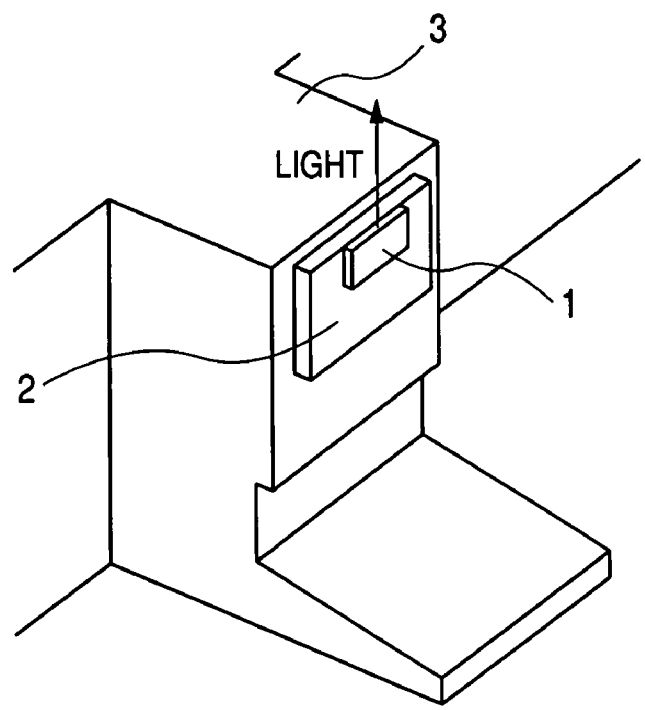
FIG. 2 is an expanded view illustrating the vicinity of the laser array chip of FIG. 1.
Figure 3:
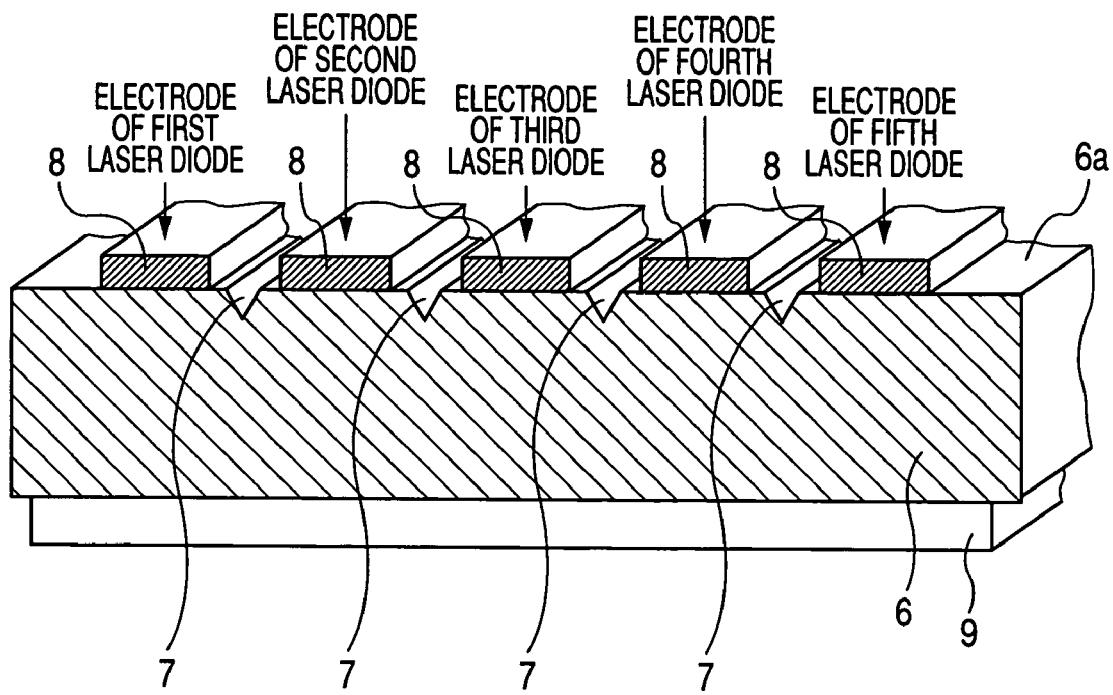
FIG. 3 is a schematic sectional view illustrating an edge emitting type laser array chip with three or more laser diodes of a related art.
Figure 4:
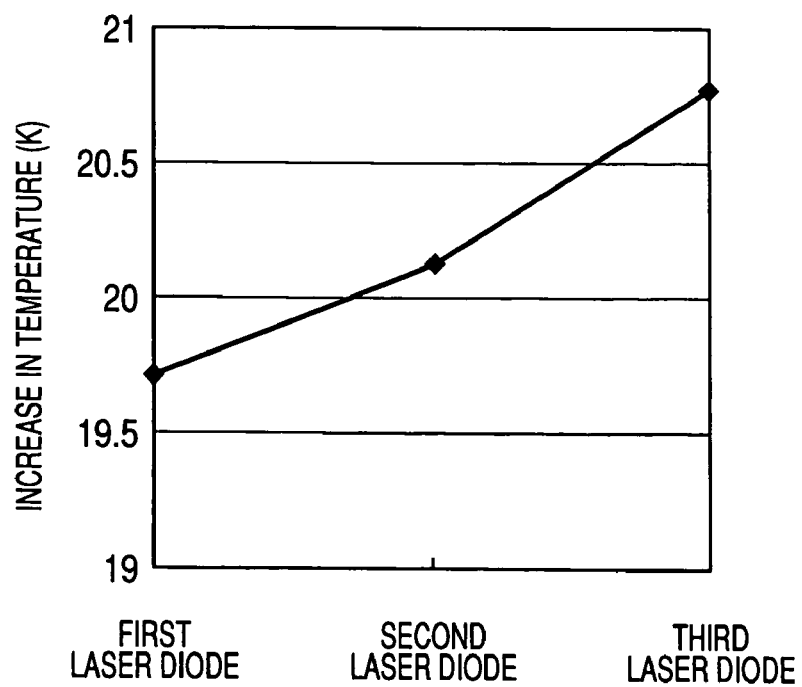
FIG. 4 is a graph showing a relationship between position of electrode of the laser array chip shown in FIG. 3 and a temperature increasing amount in operation.
Figure 6:
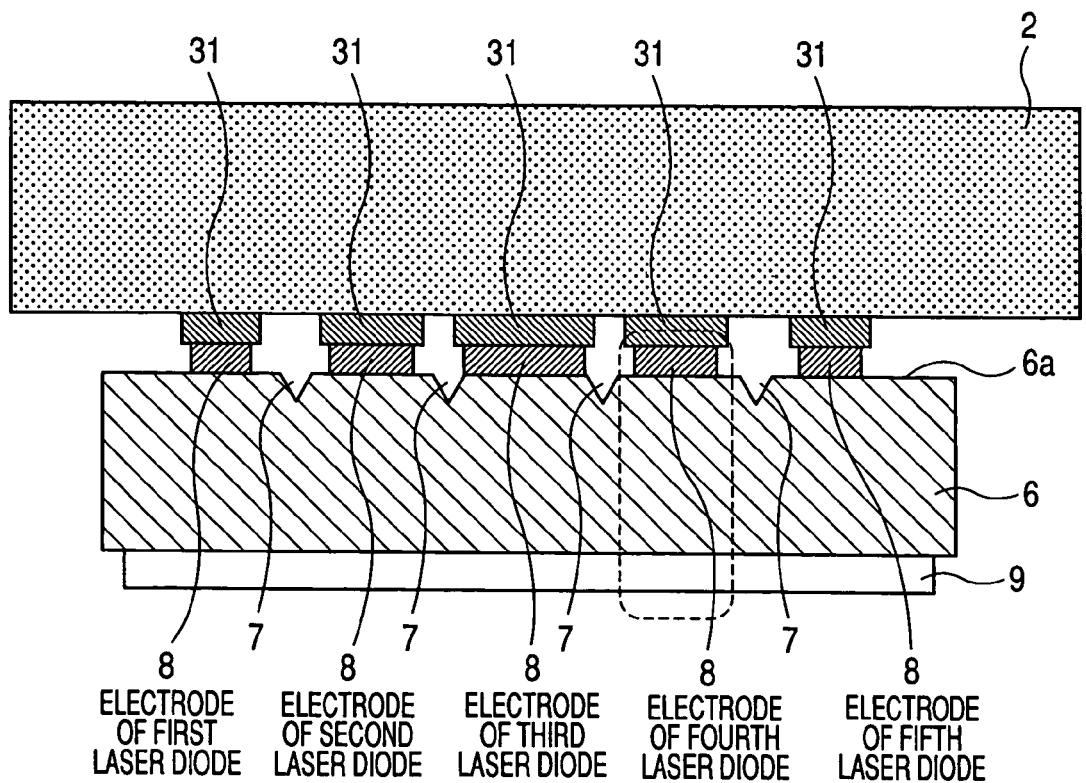
FIG. 6 is a sectional view illustrating the edge emitting type laser array chip including three or more laser diodes according to a first embodiment of the present invention.

FIGS. 1, 2, and 6 show a laser diode array according to the first embodiment.

In the laser diode array including an edge emitting type laser array chip 1, plural laser diodes electrically separated from each other by separation grooves 7 are formed in an array shape on a main surface 6a of a semiconductor substrate 6 containing gallium and arsenic, for example. The laser diodes are mounted on a mounting area of the sub-mount 2 that is provided for mounting the laser array chip 1 and that contains silicon carbide, for example, so that electrodes 8 of the laser array chip 1 is faced downward (reversely shown in the figure). A common electrode 9 is provided on the bottom surface of the semiconductor substrate 6. On the mounting area of the sub-mount 2 for the laser array chip 1, plural electrodes 31 in which solder layers are formed on surfaces thereof are arranged at positions to be opposed to the electrodes 8 of the laser array chip 1. Accordingly, the plural electrodes 31 arranged on the mounting area of the sub-mount 2 are electrically and mechanically connected to the electrodes 8 of the plural laser diodes through the solder layers.

In an area of the sub-mount 2, which is different from the mounting area, bonding pads for connecting plural bonding wires are formed. On the bonding pads, wires are formed so as to not block the laser beams. In a flange 5 of a package, plural reads 4 passing therethrough are formed. Each of the plural reads 4 is electrically isolated from one another and from the flange 5. By connecting one ends of the plural read 4 to the bonding pads, and by connecting the other ends of the plural read 4 to the outside of the package, the power is supplied to the semiconductor laser diodes.

The sub-mount 2 is connected to a heat sink 3 made of a material, such as copper, having high thermal conductivity in order to suppress heat rising of the laser diodes. In addition, the heat sink 3 is mechanically connected to the flange 5 through solder.

As shown in FIG. 6, an example is characterized in that widths of the electrodes 8 of the laser diodes are different from each other. The width of each electrode 8 refers to a length of each electrode 8 in a horizontal direction in the figure. The width of the electrode 8 of the laser diode at the center of the laser array chip 1 is larger than that of each of the electrodes 8 of the adjacent laser diodes. In addition, the widths of the electrodes 8 of the laser diodes located in each end of the laser array chip 1, that is, in the most outside thereof are the smallest. In other words, among contacting areas between the electrodes 8 of the laser diode and electrodes 31 of the sub-mount 2, the contacting area at a center position is larger than that at the end positions. With such a configuration, the heat generated in the laser diode located at the center of the laser array chip 1 easily transfers to the heat sink 3 through the sub-mount 2, thereby uniforming the temperature of each laser diode of the laser array chip 1.

The width of each electrode 31 may be set equal to or larger than that of the corresponding electrode 8. By such a configuration, in a thermal transferring path from each laser diode to the heat sink 3, the electrode 8 becomes the rate-determining step. On the other hand, if the width of each electrode 31 is smaller than that of the corresponding electrode 8, the electrode 31 becomes the rate-determining step in the thermal transferring path. In a case where the width of the electrode 8 is adjusted to uniform the heat rising among the laser diodes, if the width of each electrode 31 is slightly smaller, the influence is small. However, if the width of each electrode 31 is smaller by 20 or 30 percent, there may be caused the temperature distribution among the laser diodes.

Figure 5:
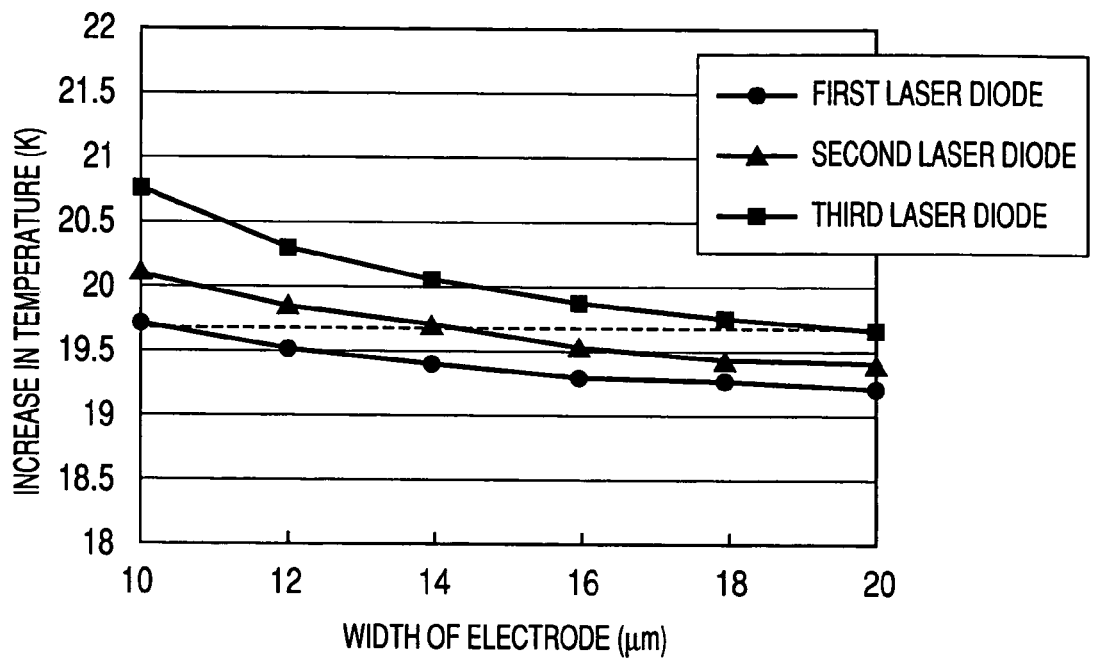
FIG. 5 is a graph showing an example of a relationship between the width of each electrode of the laser diodes and a temperature increasing amount in operation, which is obtained by a thermal analysis simulation of a two-dimensional model.

FIG. 5 is a graph showing an example of a relationship between the width of each laser diode side electrode and temperature increasing amount in operation, which is obtained by a thermal analysis simulation of a two-dimensional model using a finite element method. In this simulation, the results of a fourth laser diode and a fifth laser diode are substantially same as those of a second laser diode and a first laser diode, respectively. Therefore, the results of the forth laser diode and the fifth laser diode are omitted.

As shown in a dashed line (increase by about 19.7 K) of the graph, it is apparent that the temperature increasing of each laser diode in the operation is uniformed by configuring the width of the first laser diode, the width of the second laser diode, and the width of a third laser diode to 10 µm, 14 µm, and 20 µm, respectively.

In the first embodiment, as shown in FIG. 6, the widths of the electrodes of the laser diodes are configured so as to be different by taking into account the result shown in FIG. 5. That is, the width of the electrode 8 of the laser diode located at the center of the laser array chip 1 is lager than that of each of the electrodes 8 adjacent thereto. Moreover, the width of each of the electrodes 8 located in the ends of the laser array chip 1 is the smallest.

Figure 7:
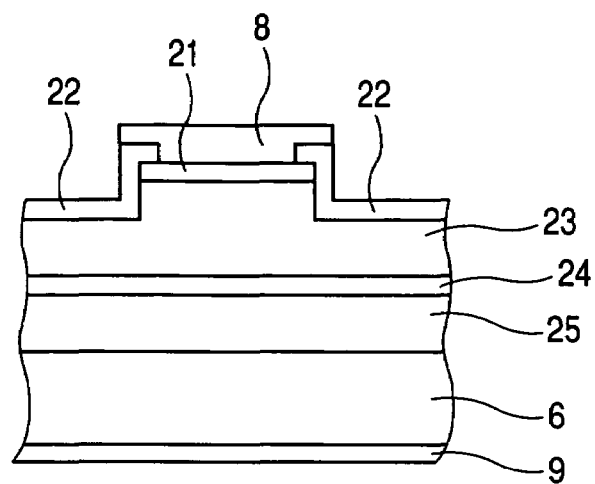
FIG. 7 is an expanded view illustrating a layer configuration of the laser diode shown in FIG. 6.

FIG. 7 is an expanded view illustrating a layer configuration of the laser diode of which a part is surrounded by a dashed line of FIG. 6.

In the figure, the laser diode according this embodiment includes a common electrode 9 formed on the bottom surface of the semiconductor substrate 6. An N-clad layer 25, an active layer 24, and a P-clad layer 23 are laminated sequentially from a downside on the upper surface of the semiconductor 6. An insulating layer 22 and a cap layer 21 are laminated on the P-clad layer 23, and the electrode 8 is formed on the cap layer 21.

According to the first embodiment, a difference of emitting wavelengths between the laser diodes can be reduced by uniforming operation temperatures of the laser diodes in the laser array chip. By using such a configuration, it is possible to provide a laser beam printing apparatus capable of performing high quality printing. In the laser beam printing apparatus, a difference in locations or spot diameters of scanning beams is small since a difference in the focal distances between the scanning beams can be reduced by reducing the emitting wavelengths of the laser diode.

Although the widths of the electrodes of the laser diodes in the horizontal direction are adjusted in the embodiment, widths of the electrodes in the depth direction in figures may be adjusted.

Second Embodiment

Figure 8:
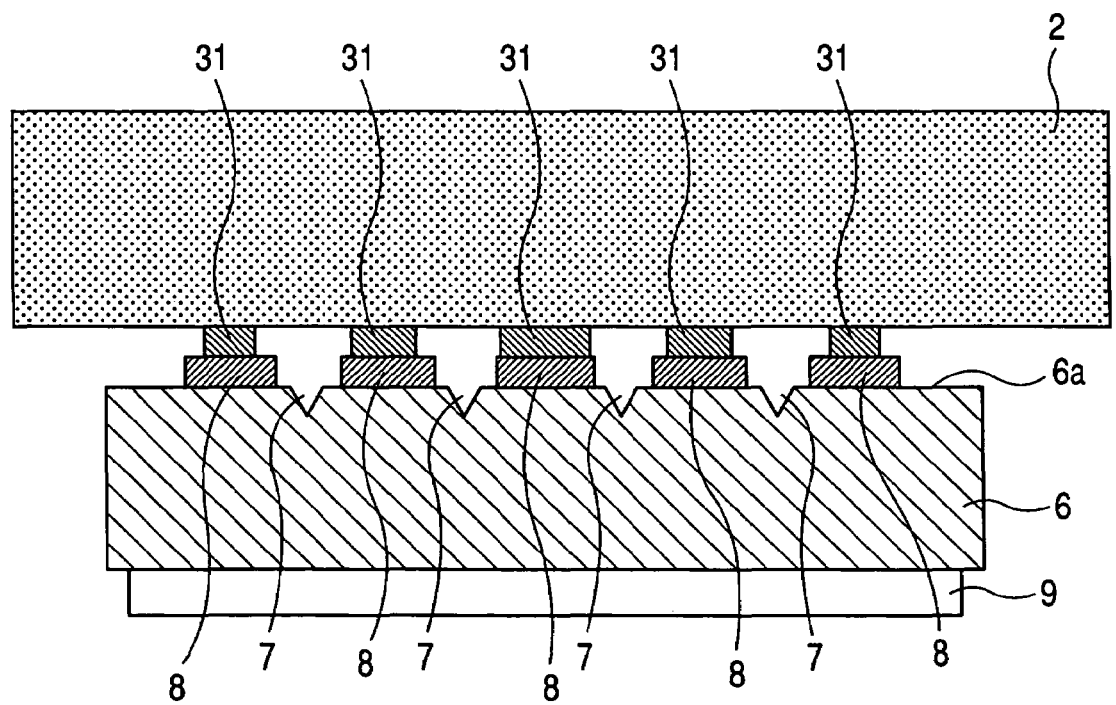
FIG. 8 is a sectional view illustrating a laser array chip and a sub-mount according to a second embodiment of the present invention.

FIG. 8 is a sectional view illustrating a laser array chip and a sub-mount according to the second embodiment.

In the figure, the widths of electrodes 8 of laser diodes are equal to each other, and the widths of the electrodes 31 of the sub-mount 2 coming in contact with the electrodes 8 are different from each other. That is, among the electrodes 31 of the sub-mount 2, the electrode 31 corresponding to the electrode 8 located at the center of the laser array chip 1 is larger than that of the electrodes 31 corresponding to the electrodes 8 of the adjacent laser diodes. The width of each of the electrodes 31 corresponding to the electrodes 8 located in the ends of the laser array chip 1 is the smallest. In this case, the widths of the electrodes 31 are formed to be smaller than those of the corresponding electrodes 8. Therefore, the electrodes 31 become a rate-determining step in the thermal transferring path. The widths of the electrodes 8 may set to be the same as those of the corresponding electrodes 31.

With such a configuration, even when the widths of the electrodes 8 of the laser diodes are equal to each other, it is possible to uniform emitting wavelengths between the laser diodes by uniform operation temperatures between the laser diodes.

In the above-described embodiments, five laser diodes have been used, however the more number of laser diodes may be used in the same manner.

Hereinafter, a configuration of a printing apparatus and an optical scanning device according to the present invention will be described.

Figure 9:
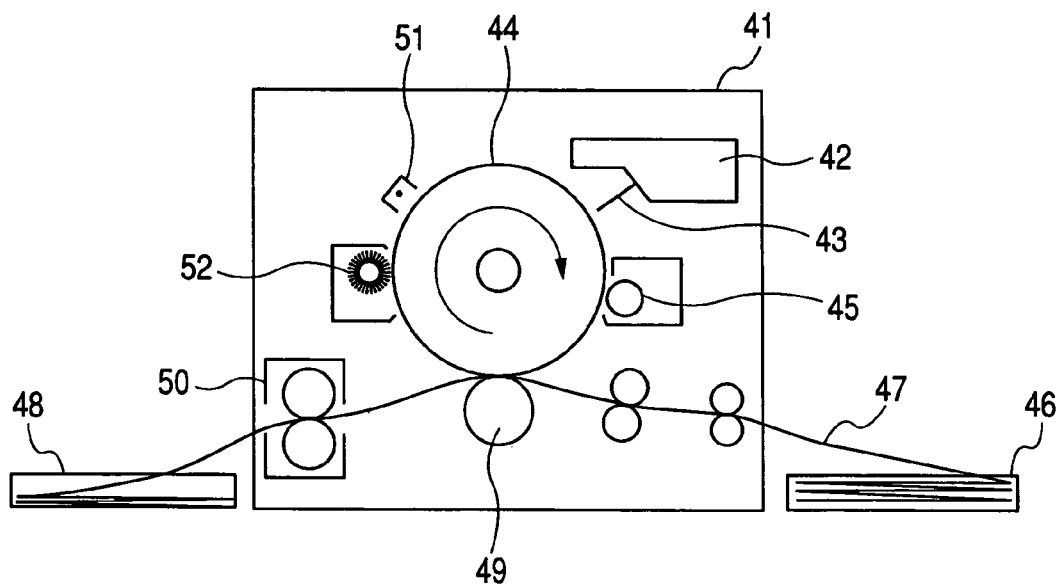
FIG. 9 is a schematic diagram illustrating a configuration of a printing apparatus to which the present invention is applied.
Figure 10:
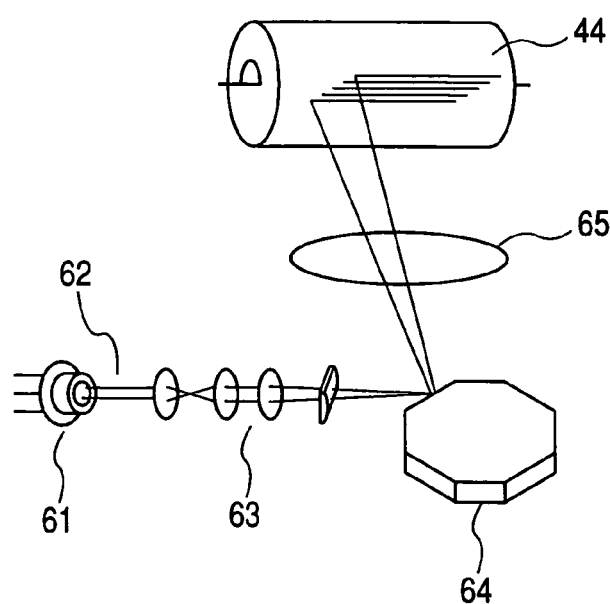
FIG. 10 is a diagram illustrating an inner configuration of an optical scanning device of the printing apparatus of FIG. 9.

FIG. 9 is a schematic diagram illustrating a configuration of the printing apparatus according to the present invention. FIG. 10 is a diagram illustrating an inner configuration of the optical scanning device of the printing apparatus of FIG. 9.

In FIG. 9, Reference Numeral 41 indicates a housing of the printing apparatus, Reference Numeral 42 indicates an optical scanning device, Reference Numeral 44 indicates a photosensitive member, Reference Numeral 49 indicates a transfer roller, and Reference Numeral 50 indicates a fixing device. A developing device 45, a charging device 51, and a charge eliminating device 52 are disposed around the photosensitive member 44. A laser beam 43 is emitted from the optical scanning device 42 to the photosensitive member 44.

When printing is performed, the charging device 51 charges the photosensitive member 44, an image is formed on the photosensitive member 44 by the laser beam 43, and the image is developed by the developing device 45. Afterward, a paper sheet 47 is fed from a feeding tray 46 to the housing 41 and the image is transferred between the photosensitive member 44 and the transfer roller 49. Subsequently, the paper sheet 47 passes through a fixing device 50 and is conveyed to a discharging tray 48. After the image is transferred by the photosensitive member 44, the charge eliminating device 52 eliminates the remaining charge on the photosensitive member 44, and the charging device 51 charges the photosensitive member for a next printing.

In FIG. 10, the optical scanning device includes a laser diode array 61, a collecting lens group 63, a polygon mirror 64, and an Fθ lens 65. A laser beam 62 emitted from the laser diode array 61 scans the photosensitive member 44 through the collecting lens group 63, the polygon mirror 64, and the Fθ lens 65.

In this way, it is possible to provide the printing apparatus in which a difference in locations or spot diameters of scanning beams is small and high quality printing is performed since a difference in the focal distances between the scanning beams can be reduced by uniforming the emitting wavelengths between the laser diodes.

What is claimed is:

1. A laser diode array comprising:
   a laser array chip including:
      a substrate; and
      at least three of laser diodes that are formed on the substrate;
   first electrodes that are formed on each of the laser diodes so as to be isolated from one another;
   a sub-mount; and
   second electrodes that are formed on the sub-mount so as to correspond to the first electrodes and so as to be isolated from one another,
   wherein the laser array chip is mounted on the sub-mount through the first electrodes and the second electrodes, and
   wherein, among contacting surfaces between each of the first electrodes and a corresponding one of the second electrodes, a contacting area of a central one of the contacting surfaces is larger than that of an end one of the contacting surfaces.

2. The laser diode array according to claim 1, wherein, among the first electrodes, a width of a central one of the first electrodes is larger than that of an end one of the first electrodes.

3. The laser diode array according to claim 1, wherein, among the second electrodes, a width of a central one of the second electrodes is larger than that of an end one of the second electrodes.

4. The laser diode array according to claim 1, wherein each of widths of the first electrodes and a corresponding one of widths of the second electrodes are set to be equal.

5. The laser diode array according to claim 1, wherein contacting areas of the contacting surfaces are adjusted by changing widths of the first electrodes.

6. The laser diode array according to claim 1, wherein contacting areas of the contacting surfaces are adjusted by changing widths of the second electrodes.

7. An optical scanning device comprising the laser diode array according to claim 1.

8. A printing apparatus comprising the laser diode array according to claim 1.

* * * * *